US006821399B2

(12) United States Patent
Weaver et al.

(10) Patent No.: US 6,821,399 B2
(45) Date of Patent: Nov. 23, 2004

(54) CATHODE MOUNTING SYSTEM FOR CATHODIC ARC CATHODES

(75) Inventors: Scott Andrew Weaver, Ballston Lake, NY (US); Don Mark Lipkin, Niskayuna, NY (US); Reed Roeder Corderman, Niskayuna, NY (US); Terry Clifford Cooper, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 272 days.

(21) Appl. No.: 10/137,220

(22) Filed: May 2, 2002

(65) Prior Publication Data

US 2002/0144893 A1 Oct. 10, 2002

Related U.S. Application Data

(63) Continuation of application No. 09/824,636, filed on Apr. 3, 2001, now Pat. No. 6,436,254.

(51) Int. Cl.$^7$ ............................................. C23C 14/32
(52) U.S. Cl. ........................ 204/298.41; 204/192.38
(58) Field of Search ...................... 204/192.38, 298.41, 204/298.12, 298.09

(56) References Cited

U.S. PATENT DOCUMENTS

| | | | |
|---|---|---|---|
| 3,793,179 A | | 2/1974 | Sablev et al. ........... 304/298.41 |
| 4,384,933 A | * | 5/1983 | Takasaki ................. 204/192.25 |
| 4,622,452 A | | 11/1986 | Bergman et al. ....... 204/298.41 |
| 5,133,850 A | | 7/1992 | Kukla et al. ........... 204/298.12 |
| 5,147,521 A | | 9/1992 | Belli et al. .............. 204/298.12 |
| 5,278,861 A | | 1/1994 | Damond et al. ....... 204/298.41 |
| 5,674,367 A | | 10/1997 | Hunt et al. ............. 204/298.12 |
| 5,676,810 A | | 10/1997 | Schwendener ......... 204/298.09 |
| 5,685,963 A | | 11/1997 | Lorimer et al. ........ 204/298.03 |
| 6,252,360 B1 | * | 6/2001 | Ito et al. ...................... 315/411 |
| 6,409,898 B1 | * | 6/2002 | Weaver et al. ......... 204/298.41 |
| 6,436,254 B1 | * | 8/2002 | Weaver et al. ......... 204/298.41 |

* cited by examiner

*Primary Examiner*—Rodney G. McDonald
(74) *Attorney, Agent, or Firm*—Robert P. Santandrea; Patrick K. Patnode

(57) ABSTRACT

An apparatus for cathodic arc coating. The apparatus includes: a vacuum chamber which includes: an anode; a power supply; and a cathode target assembly connected to the power supply. The cathode target assembly includes a cathode target having an interference fit stud with a threadless distal end. In the preferred embodiment, the distal end of the threadless cathode target also includes a predetermined surface texture and a cooling block in contact with the cathode target.

25 Claims, 6 Drawing Sheets

CATHODE MOUNTING SYSTEM FOR CATHODIC ARC CATHODES

This is a continuation of application Ser. No. 09/824,636. filed Apr. 3, 2001 now U.S. Pat. No. 6,436,254.

BACKGROUND OF THE INVENTION

The present invention relates generally to cathodic arc coating and, more particularly, to an improved cathode mounting system for cathodic arc cathodes.

The cathodic arc process is known in the art as a robust, relatively inexpensive technique for deposition of single and multi-component metallic and nonmetallic coatings. Cathodic arc deposition systems consist of a vacuum chamber which includes an anode, a power supply and a cathode. The cathode material is deposited during the operation of the system.

Often, these cathodes are mounted to the electrical (and cooling) source by means of a threaded stud. The stud is screwed into the back of the target and the stud/target assembly is then screwed to the electrical and cooling block. In certain instances, the materials to be used for deposition are difficult to manufacture with threaded mounting holes. Not only may an expensive sample be damaged but also the cost to machine each sample can become prohibitive.

Thus, there remains a need for an improved cathodic arc coating apparatus able to mount cathodes with much less machining while, at the same time, providing sufficient strength to hold the cathode in place.

SUMMARY OF THE INVENTION

The present invention is directed to an apparatus for cathodic arc coating. The apparatus includes: a vacuum chamber which includes an anode; a power supply; and a cathode target assembly connected to the power supply. The cathode target has an interference fit stud with a threadless distal end. In the preferred embodiment, the distal end of the threadless cathode target also includes a pre-determined surface texture and a cooling block in contact with the cathode target.

The cooling block includes a chamber adjacent to the cathode and a cooling fluid supply contained within the chamber. A fluid seal between the cooling block and the cathode prevents leakage of coolant into the vacuum chamber. The cooling fluid supply includes an inlet for providing cooling fluid into the chamber and an exit for withdrawing the fluid from the chamber.

The vacuum chamber includes an enclosed chamber and a staged pump for producing a vacuum therein. In the preferred embodiment, the power supply is a continuous DC power supply of greater than about 60 amps at about 20 volts.

In the preferred embodiment, the surface of the distal end of the stud is either smoothed for use with targets formed from materials harder than the materials used to form the stud, or textured for use with targets formed from materials softer than the materials used to form the stud.

In one embodiment, the interference fit is a thermally formed interference fit, wherein the material of the stud is pre-selected to have a thermal expansion coefficient greater than the thermal expansion coefficient of the material of the target, thereby maintaining the interference fit as the target is heated during use.

In another embodiment, the interference fit is a mechanically formed interference fit, wherein the mechanically formed interference fit includes a cylindrical opening in the distal end of the stud, a wedge adapted to be received within the cylindrical opening, and a screw extending through the stud into the wedge, whereby tightening the screw expands the outer walls of the cylinder of the stud to form the interference fit.

Accordingly, one aspect of the present invention is to provide an apparatus for cathodic arc coating. The apparatus includes: a vacuum chamber which includes: an anode; a power supply; and a cathode target assembly located within the vacuum chamber and connected to the power supply, the assembly having an interference fit stud with a threadless distal end.

Another aspect of the present invention is to provide a threadless cathode assembly for a cathodic arc coating apparatus. The threadless cathode assembly includes: a cathode target and an interference fit stud with a threadless distal end, wherein the distal end further includes a pre-determined surface texture.

Still another aspect of the present invention is to provide an apparatus for cathodic arc coating. The apparatus includes: a vacuum chamber which includes: an anode; a power supply; a cathode target assembly located within the vacuum chamber and connected to the power supply, the assembly having an interference fit stud with a threadless distal end, wherein the distal end further includes a pre-determined surface texture; and a cooling block in contact with the cathode.

These and other aspects of the present invention will become apparent to those skilled in the art after a reading of the following description of the preferred embodiment when considered with the drawings.

DETAILED DESCRIPTION

Figure 1:
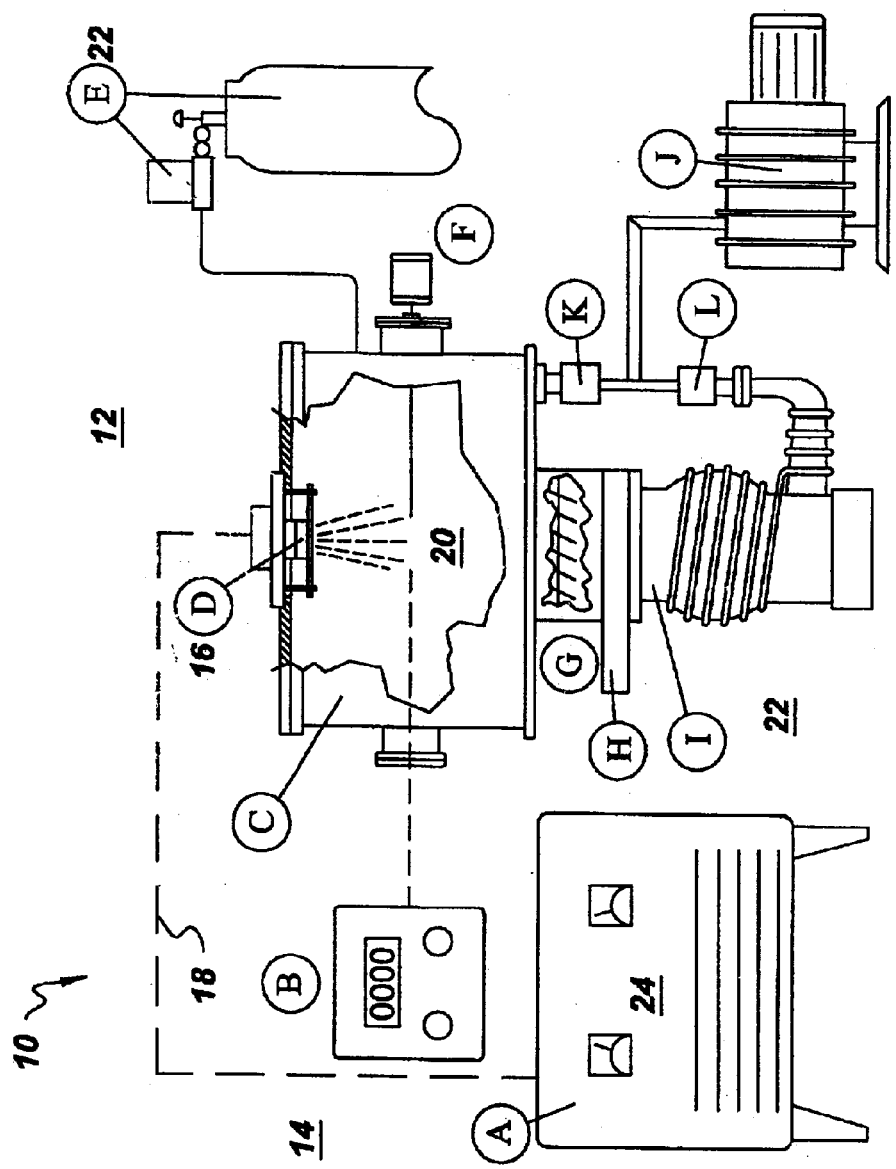
FIG. 1 is a schematic representation of a cathodic arc coating apparatus constructed according to the present invention.

In the following description, like reference characters designate like or corresponding parts throughout the several views. Also in the following description, it is to be understood that such terms as "forward," "rearward," "left," "right," "upwardly," "downwardly," and the like are words of convenience and are not to be construed as limiting terms.

Turning to the figures in general, and FIG. 1 in particular, there is shown a cathodic arc coating apparatus, generally designated 10, constructed according to the present invention. The apparatus includes three primary assemblies: a vacuum system 12 which includes: an anode; a power supply 14; and a threadless cathode assembly 16.

The vacuum system 12 includes an enclosed chamber 20 and a staged pump system 22 for removing the atmosphere from the enclosed chamber 20. In the preferred embodiment, the power supply 14 is a DC power supply 24, such as a Model MA200, including a restart circuit, available from Ion Bond of Madison Heights, Mich. In the preferred embodiment, this is a continuous DC power supply capable of producing greater than 60 amps at about 20 volts for a total power output greater than about 1200 watts at a 100% duty cycle.

As in conventional cathodic arc coating systems, a bias voltage is connected to the parts to be coated through the chamber wall and the parts may be rotated by means of a planetary drive motor to be sure that the parts are uniformly coated. The vacuum chamber staged pump system 22 is also of generally conventional design, including a throttle valve and gate valve to allow the chamber 20 to be isolated from a diffusion pump and a rough pump downstream from of the diffusion pump. A chamber rough valve and a foreline valve allow the chamber to be evacuated before the diffusion pump is engaged. A process gas supply may also be used to partially backfill the chamber with an inert or selectively reactive gas.

Figure 2:
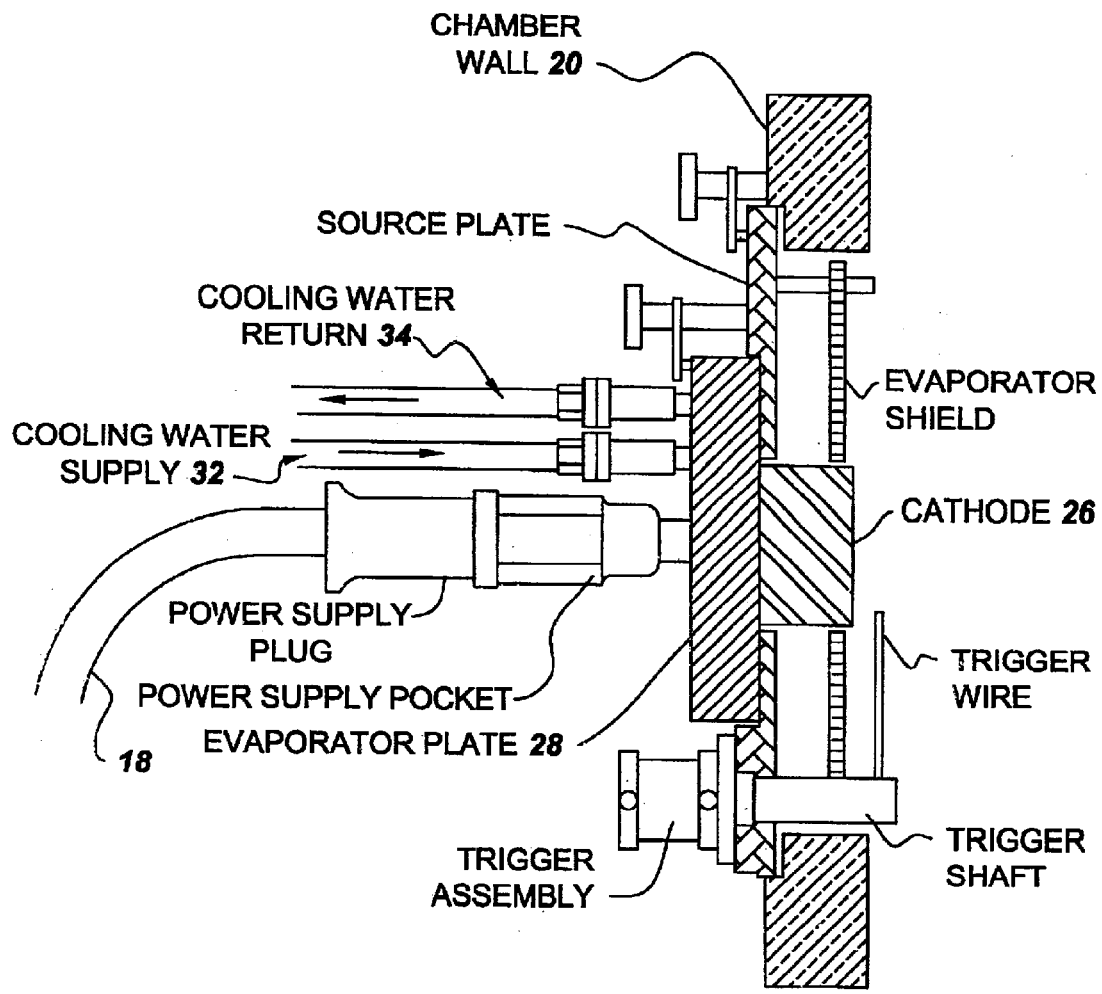
FIG. 2 is an enlarged cross-sectional view of the cathode assembly shown in FIG. 1.

Turning now to FIG. 2, there is shown an enlarged cross-sectional view of the cathode assembly 16 shown in FIG. 1. As can be seen, the threadless target cathode 26 is attached to a cooling block 28 through which power supply 18 is fed into the threadless target cathode 26. In addition, in the preferred embodiment, the cooling block 28 has a supply of cooling fluid, such as water through inlet 32, which then returns the cooling water through outlet 34. This entire assembly is attached to the top wall of chamber 20.

Figure 3:
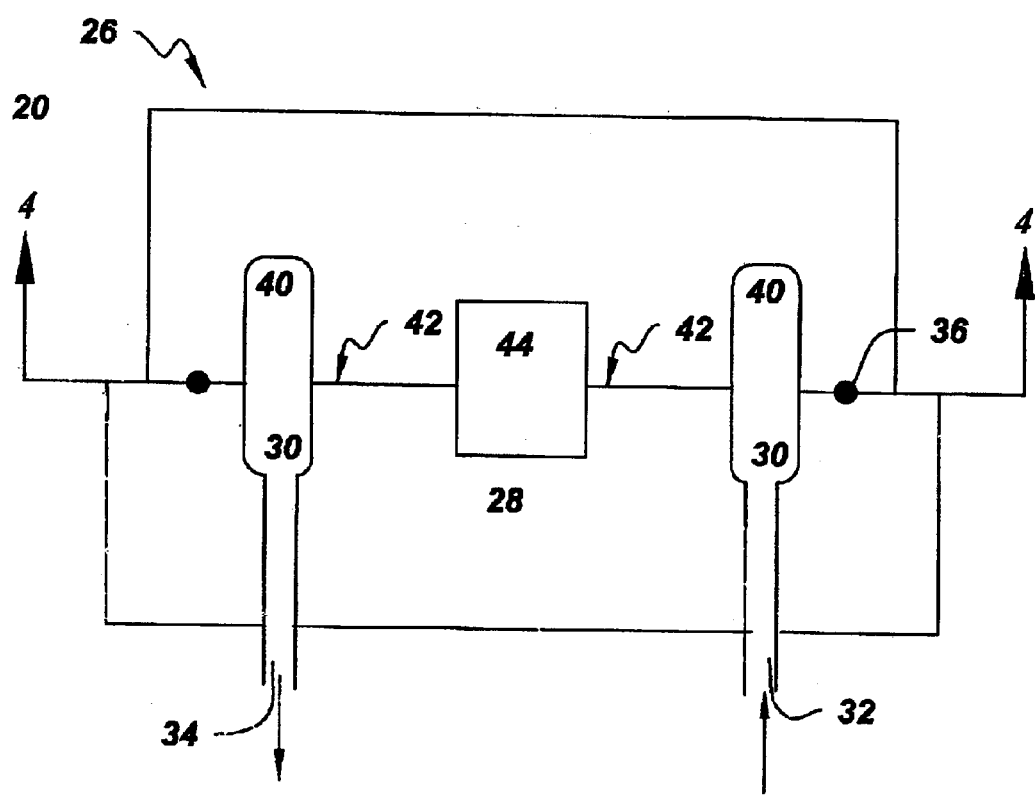
FIG. 3 is a cross-sectional schematic view of the cooling block sub-assembly of the present invention.

The preferred embodiment of the present invention can best be seen in FIG. 3, which is a cross-sectional schematic view of the cooling block 28 and the threadless cathode assembly 16. As will be appreciated, many useful target materials are inherently hard to machine, since the reason that they are being applied in the first place is to improve wear or abrasion resistance to the underlying work piece. Accordingly, it is very important to be able to mount the target cathode with the minimum amount of machining.

In the preferred embodiment, a conventional cooling block 28 is used in contact with the threadless target cathode 26. This cooling block includes a fluid chamber 30 adjacent to the back wall of the threadless target cathode 26 for receiving the cooling fluid supply. In the preferred embodiment, the coolant is water, which is fed through inlet 32 and out of exit 34. However, in some situations, a molten salt, gas or similar high heat capacity or high heat conductivity material could be used within this chamber.

When a liquid such as water is used, it is important that a seal, such as O-ring 36, be between two chambers to prevent the cooling fluid from flash vaporizing into the vacuum chamber, which could compromise the quality of the coating and may result in destruction of the downstream diffusion pump.

In the present invention, the chamber 30 from the cooling block 28 are preferably extending into the portion of the cathode assembly 16 along a channeled chamber 40, which is coextensive along with the chamber 30 in the cooling block 28. As can be seen, this results in a substantial increase in the surface area where the cooling fluid is contacting the threadless target cathode 26. Such an increase in cooling capacity allows a significant amount of energy, up to greater than 1200 watts, to be added. However, in order to be able to absorb this amount of power and to conduct it to the target, a portion of the threadless target cathode 26 is left as a conductor segment 42. In the preferred embodiment, a stud 44 having a threadless distal end is attached to the threadless target cathode 26 to allow the threadless target cathode 26 to be securely attached to the cooling block 28 and improve conduction of both heat and power.

Figure 4:
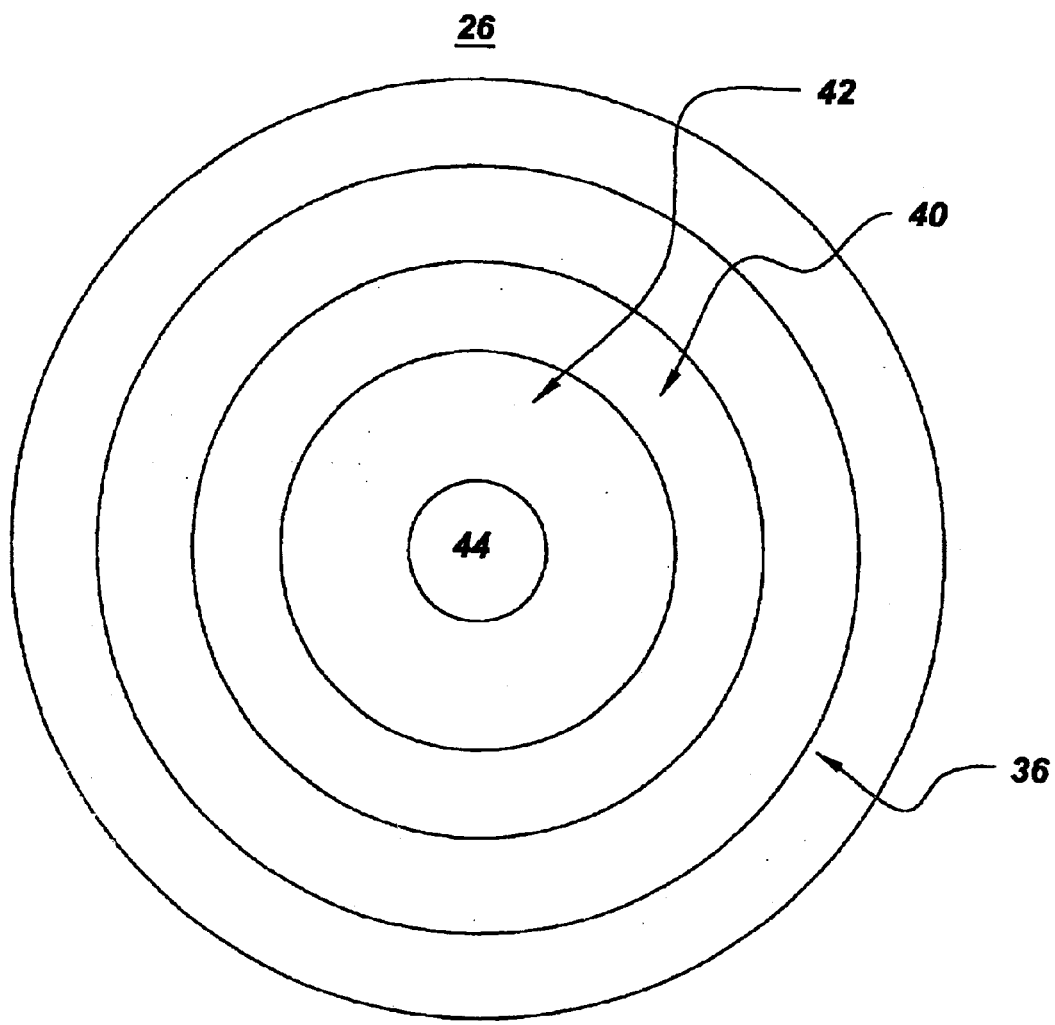
FIG. 4 is a perspective view of the threadless cathode assembly of the present invention.

As best seen in FIG. 4, there is a shown a perspective view of the threadless cathode assembly of the present invention. The interference fit stud 44 is threaded on one end and has a releasable distal end 46. The threadless target cathode 26 includes an aperture 48 sized to receive distal end 46.

Figure 5:
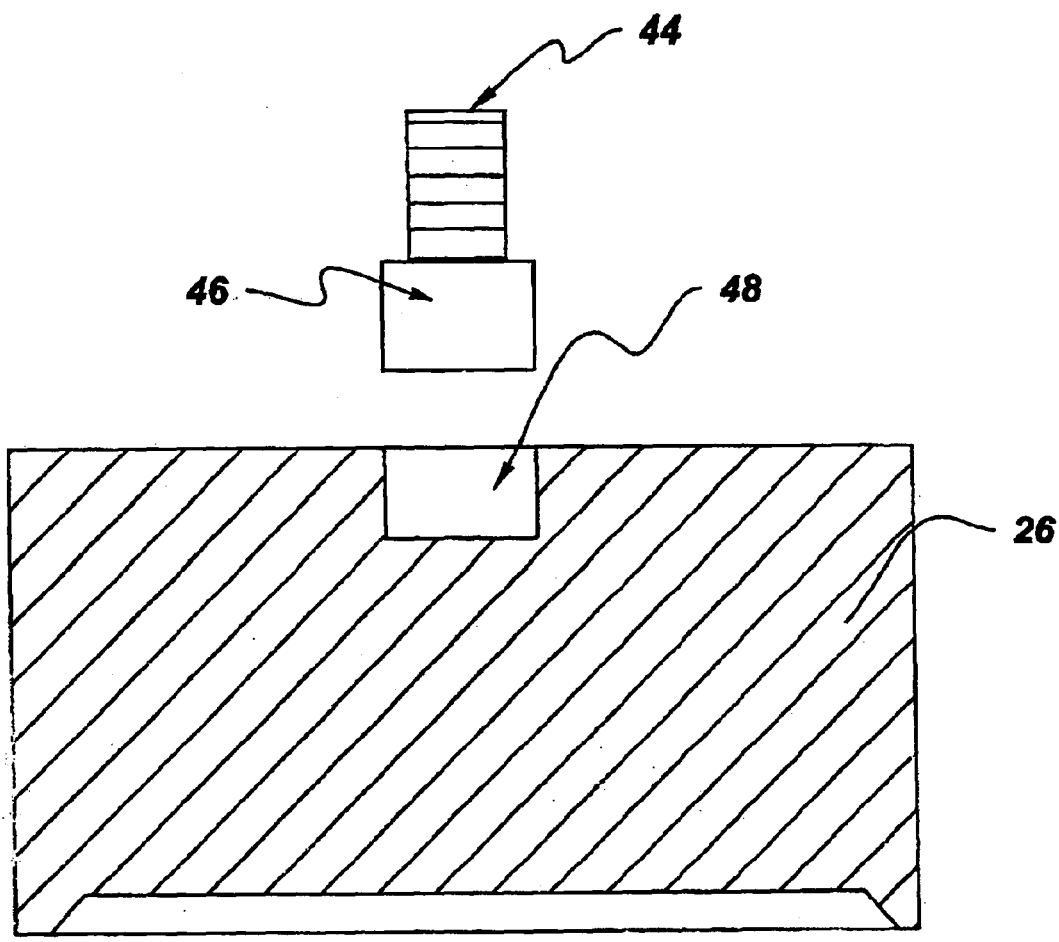
FIG. 5 is a cross-sectional view of the thermally formed embodiment of the threadless cathode assembly.

In one embodiment, shown in FIG. 5, the thermal expansion of the threadless distal end stud is chosen to be greater than the thermal expansion of the target. Then, by cooling the stud sufficiently, the stud can be pressed into target aperture 48, and upon returning to room temperature, form an interference fit.

An illustrative example shows dimensions used when the stud is stainless steel and the target is a material having a lower thermal expansion, such as about 13×10EE−6/degrees C. For these materials, in which the stainless steel has a thermal expansion of about 17.2×10EE−6/degrees C., and the thermal expansion of the target material is about 13.3×10EE−6/degrees C., the distal end of the threadless distal end stud is chosen to be about 0.0004 inch greater than the inside of the diameter of aperture 48. Since the diameter of the distal end 46 of the stud 44 is about 0.5 inch, cooling the threadless distal end stud down to about −40° C. is usually sufficient to allow the stud to be pressed into the aperture 48 of threadless target cathode 26.

Figure 6:
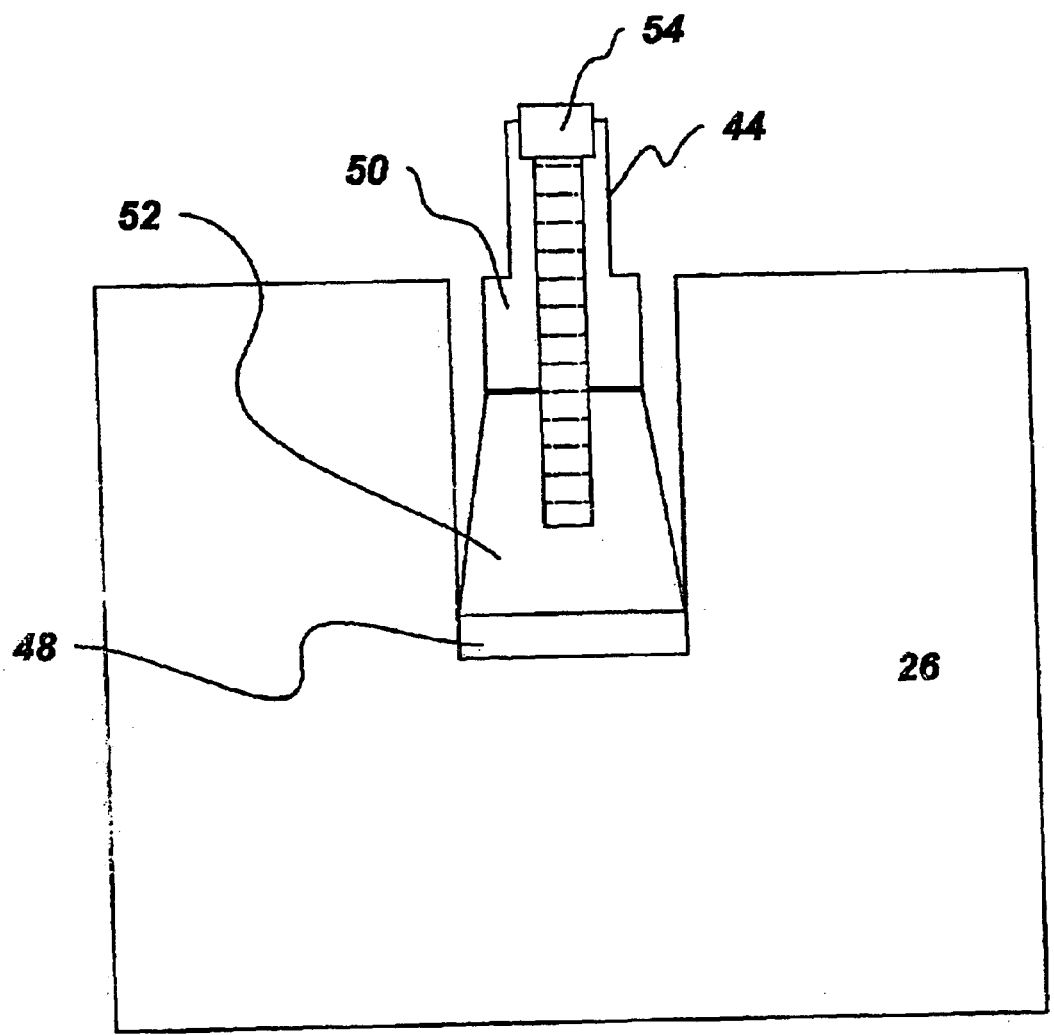
FIG. 6 is a cross-section view of the mechanically formed embodiment of the threadless cathode assembly.

In some cases, a higher strength arrangement may be desired. In this case, the threadless distal end stud 44 is adapted for a mechanical interference fit, shown in FIG. 6. Specifically, the distal end 46 of the threaded stud is cut to form a tapered cylinder 50, which receives an oversized wedge 52. A screw, such as a hex-head screw, is then tapped through the length of stud 44 and into oversize wedge 52. Upon tightening screw 54, wedge 52 is pulled into cylinder 50, therefore expanding the tapered cylinder 50 and forming an interference fit within aperture 48.

In the most preferred embodiment of the present invention, the surface of the distal end 46 of the stud 44 is controlled with respect to the target material. Specifically, if the target material is harder than the stud material, the surface of the distal end 46 is smoothed to better distribute the load of the hard material against the softer stud material. Alternatively, if the target material is softer than the material used for the threadless distal end stud, the surface of the stud may be textured so that, upon compression, the softer material will flow into the textured surface and improve the mechanical bond between the threadless distal end stud and the target material.

Certain modifications and improvements will occur to those skilled in the art upon a reading of the foregoing description. By way of example, a cross pin could be added to further secure the stud when the cost of machining or the cost of the material allows or justifies the additional expense. It should be understood that all such modifications and improvements have been deleted herein for the sake of conciseness and readability but are properly within the scope of the following claims.

We claim:

1. An apparatus for cathodic arc coating, said apparatus comprising:

(a) a vacuum chamber which includes an anode;

(b) a power supply;

(c) a cathode target located within said vacuum chamber and connected to said power supply, said cathode target having at least one concentric channeled chamber disposed in a back wall and an interference fit stud with a threadless distal end; and (d) a cooling block in contact with said back wall of said cathode target, wherein sad cooling block includes a chamber adjacent to said at least one concentric channeled chamber such that said chamber and said channeled chamber combine to form a single chamber, wherein said single chamber is adapted to contain a cooling fluid.

2. The apparatus according to claim 1, further including a fluid seal between said cooling block and said cathode target.

3. The apparatus according to claim 1, wherein said cooling fluid supply is water.

4. The apparatus according to claim 1, wherein said cooling block includes an inlet for providing a cooling fluid into said chamber and an exit for withdrawing die fluid from said chamber.

5. The apparatus according to claim 1, wherein said vacuum chamber includes an enclosed chamber and a staged pump for producing a vacuum therein.

6. The apparatus according to claim 1, wherein said power supply is a DC power supply.

7. The apparatus according to claim 6, wherein said DC power supply is a continuous DC power supply.

8. The apparatus according to claim 7, wherein said DC power supply provides a DC voltage of about 20 volts.

9. The apparatus according to claim 8, wherein said continuous DC power supply is capable of providing a current greater than about 60 amps.

10. A threadless cathode assembly for a cathodic arc coating apparatus, said threadless cathode assembly comprising:

(a) a cathode target having at least one concentric channeled chamber disposed in a back wall, wherein said at least one concentric channeled chamber is mateable with an adjacent cooling chamber in said cathodic arc coating apparatus to form a single chamber; and (b) an interference fit stud with a threadless distal end, wherein said distal end further includes a pre-determined surface texture.

11. The threadless cathode assembly according to claim 10, wherein said stud is formed from-stainless steel and wherein said pre-determined surface texture of said distal end of said stud is smoothed for use with cathode targets formed from materials that are harder than said stud.

12. The threadless cathode assembly according to claim 10, wherein said stud is formed from stainless steel and wherein said pre-determined surface texture of said distal end of said stud is textured for use with cathode targets formed from materials that are softer than said stud.

13. The threadless cathode assembly according to claim 10, wherein said interference fit is a mechanically formed interference fit.

14. An apparatus for cathodic arc coating, said apparatus comprising:

(a) a vacuum chamber which includes an anode;

(b) a power supply connected to said vacuum chamber;

(c) a cathode target assembly located within said vacuum chamber connected to said power supply, said assembly including a cathode target having at least one concentric channeled chamber disposed in a back wall and an interference fit stud with a threadless distal end and, wherein said distal end further includes a pre-determined surface texture; and (d) a cooling block in contact with said back wall of said cathode target, wherein said cooling black includes a chamber adjacent to said, at least one concentric channeled chamber in said cathode target such that said chamber and said channeled chamber combine to form a single chamber, and wherein said single chamber is adapted to contain a cooling fluid.

15. The apparatus according to claim 14, further including a fluid seal between said cooling block and said cathode target.

16. The apparatus according to claim 14, wherein said cooling fluid supply is water.

17. The apparatus according to claim 14, wherein said cooling block includes an inlet for providing a cooling fluid into said chamber and an exit for withdrawing the fluid from said chamber.

18. The apparatus according to claim 14, wherein said vacuum chamber includes an enclosed chamber and a staged pump for producing a vacuum therein.

19. The apparatus according to claim 14, wherein said power supply is a DC power supply.

20. The apparatus according to claim 19, wherein said DC power supply is a continuous DC power supply.

21. The apparatus according to claim 20, wherein said DC power supply provides a DC voltage of about 20 volts.

22. The apparatus according to claim 21, wherein said continuous DC power supply is capable of providing a current greater than about 60 amps.

23. The apparatus according to claim 14, wherein said stud is formed from stainless steel and wherein said pre-determined surface texture of said distal end of said stud is smoothed for use with cathode targets formed from materials that are harder than said stud.

24. The apparatus according to claim 14, wherein said stud is formed from stainless steel and wherein said pre-determined surface texture of said distal end of said stud is textured for use with cathode targets formed from materials that are softer than said stud.

25. The apparatus according to claim 14, wherein said interference fit is a mechanically formed interference fit.

* * * * *